(12) United States Patent
Champion

(10) Patent No.: US 7,046,173 B2
(45) Date of Patent: May 16, 2006

(54) METHOD AND DEVICE FOR CONVERTING A QUANTIZED DIGITAL VALUE

(75) Inventor: Gaël Champion, Paris (FR)

(73) Assignee: EADS Telecom, Montigny le Bretonneux (FR)

( * ) Notice: Subject to any disclaimer, the term of this patent is extended or adjusted under 35 U.S.C. 154(b) by 91 days.

(21) Appl. No.: 10/500,061

(22) PCT Filed: Dec. 18, 2002

(86) PCT No.: PCT/FR02/04433

§ 371 (c)(1),
(2), (4) Date: Jul. 20, 2004

(87) PCT Pub. No.: WO03/056702

PCT Pub. Date: Jul. 10, 2003

(65) Prior Publication Data

US 2004/0252039 A1    Dec. 16, 2004

(30) Foreign Application Priority Data

Dec. 26, 2001 (FR) ................................. 01 16874

(51) Int. Cl.
*H03M 7/34* (2006.01)
(52) U.S. Cl. ........................................ 341/51; 341/143
(58) Field of Classification Search ................ 341/143
See application file for complete search history.

(56) References Cited

U.S. PATENT DOCUMENTS 5,699,113 A * 12/1997 Ohiwa ..................... 348/240.3
6,154,095 A * 11/2000 Shigemori et al. ............ 331/16
2001/0050959 A1* 12/2001 Nishio et al. ................ 375/243

FOREIGN PATENT DOCUMENTS

WO    WO 01/24357    4/2001

OTHER PUBLICATIONS

International Search Report of PCT/FR02/04433 dated Apr. 15, 2003.
Perrott et al., "A 27-MW CMOS Fractional-N Synthesizer Using Digital Compensation for 2.5-MB/S GFSK Modulation" *IEEE Journal of Solid-state Circuits*, IEEE Inc. New York, US, vol. 32, No. 12, Dec. 1, 1997, pp. 2048-2060.

* cited by examiner

*Primary Examiner*—Rexford Barnie
*Assistant Examiner*—Joseph Lauture
(74) *Attorney, Agent, or Firm*—McCracken & Frank LLP

(57) ABSTRACT

The invention concerns a method and a device for converting an input digital value quantized in accordance with a first quantization factor and encoded on at most n1 bits, into an output digital value quantized in accordance with a second quantization factor and encoded on at most n2 bits. The method comprises the steps of: multiplying the input digital value by an integer B, encoded on at most β bits, so as to generate an intermediate digital value; and dividing, in fixed point, the first intermediate digital value by the number $2^\alpha$, where α is an integer not greater than n1+β, generating the output digital value. The number $B/2^\alpha$ is substantially equal to the ratio of the second quantization factor over the first quantization factor. Additionally, the divider means comprise a Sigma-Delta modulator.

16 Claims, 3 Drawing Sheets

METHOD AND DEVICE FOR CONVERTING A QUANTIZED DIGITAL VALUE

BACKGROUND OF THE INVENTION

1. Technical Field

The present invention relates to the field of fixed-point digital signal processing. Applications may be found for it in any fixed-point digital system, and particularly in the digitally modulated synthesizers used in the radio transmitters and the radio transceivers of a digital radiocommunication system.

2. Related Art

For carrying out operations on binary numbers, a floating-point digital system comprises software resources such as a correctly programmed DSP (Digital Signal Processor). A fixed-point system, however, only comprises sequential logic circuits such as digital adders, digital multipliers, shift registers or the like.

The binary numbers which are processed by a fixed-point digital system encode quantized values corresponding to a real value X (for example the variable value of the radio signal received by a radio receiver, or the constant value of the frequency of a radio channel). These quantized numbers are represented by integers between zero and $2^n-1$—where n is the number of bits used for encoding the information—if the value X is always positive, or between $-(2^n-1)$ and $2^n-1$ if the value X is signed (that is, if it can be negative). By convention, Xq denotes the quantized value which is obtained from the real value X by a quantizing operation. For linear quantizing, the correspondence between the real value X (so-called real information) and the quantized value Xq (so-called quantized information) is given by the relation:

$$Xq = \text{round}(X \times Cq) \quad (1)$$

where Cq is a real number referred to as the quantization coefficient.

The quantization of the system is determined by the number Cq in relation with the number n. The quantization coefficient Cq is such that:

$$\begin{cases} \text{round}(|X(t)| \times Cq) \leq 2^{n-1} - 1, \forall t, \text{ if the information } X \text{ is signed} \\ \text{round}(X(t) \times Cq) \leq 2^n - 1, \forall t, \text{ otherwise} \end{cases} \quad (2)$$

where |x| denotes the absolute value operator of the real variable x.

The act of quantizing the information X creates an error, referred to as the quantization error and denoted by e, such that:

$$e = X - \frac{Xq}{Cq} = X - \frac{\text{round}(X \times Cq)}{Cq} \quad (3)$$

The error e is of course variable, inasmuch as it depends on the value X. According to the properties of the rounding function, the error e is always such that $$|e| \leq \frac{1}{2 \times Cq}.$$

The maximum value of the quantization error, denoted by $e_{max}$, is therefore given by:

$$e_{max} = \frac{1}{2 \times Cq} \quad (4)$$

The inverse of the quantization coefficient Cq is the resolution of the digital system, that is to say the smallest variation of the real information which is distinguishable in the quantized information. Put another way, $$\frac{1}{Cq}$$

is such that if $$X = \frac{1}{Cq} + X'$$

then Xq=1+Xq'.

Optimization of the dynamic range of the system generally leads to the quantization being defined by choosing Cq such that:

$$\begin{cases} Cq = \frac{\max(|X(t)|)}{2^{n-1} - 1}, \forall t, \text{ if the information } X \text{ is signed} \\ Cq = \frac{\max(X(t))}{2^n - 1}, \forall t, \text{ otherwise} \end{cases} \quad (5)$$

Certain systems dictate the quantization of the digital data, for example in order to be compatible with analog signals after digital-analog conversion of a quantized signal. In this case, there is a quantization error majored in modulus by $$e_{max} = \frac{1}{2 \times Cq},$$

where Cq is the corresponding quantization coefficient. However, it may arise that this resolution is insufficient for representing some or all of the digital signals of the system.

On the other hand, certain digital systems use constant digital values. In a radio transmitter or receiver, for example, such a digital constant may represent the central frequency of a radio channel. In this case, the situation may be encountered in which a quantization error affecting the digital constant (this error being systematic inasmuch as it does not vary) exceeds the maximum tolerable error for digital representation of this constant. If the system does not dictate the quantization of the digital data, then the systematic quantization error affecting a specific digital constant K may be reduced, albeit this may mean that the dynamic range of the system is not optimized, by choosing the quantization coefficient Cq such that $$K - \frac{\text{round}(K \times Cq)}{Cq} \leq e_d \leq e_{\max},$$

where $e_d$ is the maximum tolerable error for digital representation of the constant K. This is not always possible in a system which dictates the quantization of the digital data, such as a digitally modulated frequency synthesizer, for example.

BRIEF DESCRIPTION OF THE INVENTION

This is why a first aspect of the present invention reduces the quantization errors of a digital signal and or to digitally correct a systematic quantization error of a digital value (in particular a constant value) without any constraint governing the quantization, that is to say without any constraint governing n and Cq.

It is moreover possible for digital data obtained from two subsystems, having respective quantizations determined by distinct quantization coefficients, to be used in a digital system only if one of the two quantization coefficients is an integer multiple of the other.

Specifically, if data obtained from a first subsystem, having a quantization determined by a first coefficient Cq1, are intended to be used in the same digital system with digital data obtained from a second subsystem, having a quantization determined by a second coefficient Cq2 different to Cq1, then Cq1 and/or Cq2 must be chosen such that Cq2=r×Cq1 or Cq1=r×Cq2, where r is an integer.

The data can then be rendered uniform by multiplying the data of the first subsystem or of the second subsystem, as applicable, by r. This, however, is only possible if at least one of the subsystems does not dictate the quantization of the digital data.

This is why the first aspect of the present invention allows a plurality of digital systems to be connected together, while insuring compatibility of the data but without any constraints governing their respective quantizations.

Said first aspect of the invention thus provides a method for converting a digital input value quantized according to a first quantization coefficient and encoded over and most n1 bits, into a digital output value quantized according to a second quantization coefficient and encoded over at most n2 bits, where n1 and n2 are nonzero integers.

The method comprises the steps consisting in:

a) multiplying the digital input value by an integer B encoded over at most β bits, where β is a nonzero integer, in order to generate a first intermediate digital value encoded over at most n1+β bits; and b) fixed-point dividing said first intermediate digital value by the number $2^\alpha$, where α is an integer less than or equal to n1+β, in order to generate said digital output value.

According the invention, the number $$\frac{B}{2^\alpha}$$

is substantially equal to the ratio of said second quantization coefficient to said first quantization coefficient. Step b) is furthermore carried out by means of a sigma-delta modulator (Σ-Δ modulator). This is preferably a $1^{st}$ order Σ-Δ modulator, which is the simplest to use.

It will be noted that digital/digital conversion is involved, that is to say both the digital output value and the digital input value are quantized digital values. What changes is the quantization of this digital value. In particular, the Σ-Δ modulator is a digital/digital modulator.

A second aspect of the invention also provides a device for converting a digital input value quantized according to a first quantization coefficient and encoded over at most n1 bits, into a digital output value quantized according to a second quantization coefficient and encoded over at most n2 bits, where n1 and n2 are nonzero integers.

The device comprises multiplier means for multiplying the digital input value by an integer B encoded over at most β bits, where β is a nonzero integer. These multiplier means generate a first intermediate digital value encoded over at most n1+β bits. The device furthermore comprises divider means for fixed-point dividing said first intermediate digital value by the number 2α, where a is an integer less than or equal to n1+β. These divider means generate said digital output value.

According the invention, the number $$\frac{B}{2^\alpha}$$

is substantially equal to the ratio of said second quantization coefficient to said first quantization coefficient. Said divider means furthermore comprise a sigma-delta (Σ-Δ) modulator.

As is known, a Σ-Δ modulator is a circuit synchronous with the sampling frequency of the input signal. It performs quantization "noise shaping" at the high frequencies. A signal with a reduced quantization noise at the useful frequencies is recovered at the output of the Σ-Δ modulator. On average, that is to say at a low frequency compared with the sampling frequency, the gain of the device is equal to $$\frac{B}{2^\alpha}.$$

A digital output value which corresponds, with good precision, to the digital input value multiplied by the ratio of said second quantization coefficient to the first quantization coefficient is therefore obtained at the output of the Σ-Δ modulator.

The principle of the invention is based on the following concept. In what follows, Sq1 will denote the digital input value (quantized information) and Cq1 will denote the first quantization coefficient. Likewise, Sq2 will denote the digital output value (quantized information) and Cq2 will denote the second quantization coefficient. Lastly, S will denote the real value (unquantized information) corresponding to Sq1 and Sq2. The relations below are then written:

$$Sq2 = \text{round}(S \cdot Cq2) \tag{6}$$

$$\text{whence } Sq2 \cong \text{round}(S \cdot Cq1) \cdot \frac{Cq2}{Cq1} \tag{7}$$

$$\text{whence } Sq2 \cong Sq1 \cdot \frac{Cq2}{Cq1} \tag{8}$$

-continued that is to say $Sq2 \cong Sq1 \cdot \frac{B}{2^\alpha}$ (9)

with $\frac{Cq2}{Cq1} \cong \frac{B}{2^\alpha}$ (10)

It can be seen that the effect of the invention is to implement relation (9) by using relation (10). It therefore makes it possible to convert the digital value Sq1 into a digital value Sq2, which are information quantized according to different respective quantization coefficients Cq1 and Cq2 and which both correspond to the same real information S, without any restrictive assumption being made about the relation between one of these quantization coefficients and the other.

The invention thus makes it possible to reduce the quantization error affecting a variable or constant real value. Specifically, it is sufficient to choose the first quantization coefficient Cq1 so as to minimize the quantization error affecting the digital value Sq1, and to convert this value by delivering it as a digital input value to a device according to the invention, in order to obtain a digital output value Sq2 quantized according to a second quantization coefficient Cq2, which will be chosen as being that of the quantization of the subsystem needing to use the digital input value. The quantization error affecting the digital value Sq2 can thus be reduced without any constraints governing the quantization of the subsystem.

This is shown by the following calculation of the quantization error e affecting the real value S, in the case when the device according to the invention is used.

The expression for e is given by:

$$e = S - \frac{\left(Sq1 \cdot \frac{B}{2^\alpha}\right)}{Cq2}$$ (11)

But $Sq1 = \text{round}(S.Cq1)$.
Whence $$|Sq1| \leq |S.Cq1| + \frac{1}{2} \text{ and } -Sq1 \leq -S.Cq1 + \frac{1}{2}$$

From this it follows:

$$e \leq S - \frac{\left(S \cdot Cq1 \cdot \frac{B}{2^\alpha}\right)}{Cq2} + \frac{1}{2} \cdot \frac{\left(\frac{B}{2^\alpha}\right)}{Cq2}$$

i.e. $|e| \leq |S| \cdot \left|1 - \frac{Cq1}{Cq2} \cdot \frac{B}{2^\alpha}\right| + \frac{1}{2} \cdot \frac{\left(\frac{B}{2^\alpha}\right)}{Cq2} =$ $$|S| \cdot \left|1 - \frac{Cq1}{Cq2} \cdot \frac{B}{2^\alpha}\right| + \frac{1}{2 \cdot Cq1} \cdot \left(\frac{Cq1}{Cq2} \cdot \frac{B}{2^\alpha}\right)$$

The choice of B and $\alpha$ gives $$\frac{Cq1}{Cq2} \cdot \frac{B}{2^\alpha} = 1 + \varepsilon,$$

where $\varepsilon$ denotes a negligible quantity compared with unity ($\varepsilon = o(1)$). It then follows:

$$|e| \leq |S| \cdot |\varepsilon| + \frac{1}{2 \cdot Cq1} \cdot (1 + \varepsilon) \cong |S| \cdot |\varepsilon| + \frac{1}{2 \cdot Cq1}$$ (12)

The quantization error of the quantized value Sq2 obtained by the method according to the invention is therefore at most equal to the sum, on the one hand, of the maximum quantization error of the value Sq1 quantized according to the quantization coefficient Cq1 and, on the other hand, an image of the real value S which will in general be negligible. With a quantization according to the quantization coefficient Cq2, there would have been an error majored by $$\frac{1}{2 \cdot Cq2}.$$

In order to reduce the quantization error affecting the value of Sq2 in the subsystem that uses this value, the value of Cq1 will advantageously be chosen such that Cq1 is greater than Cq2 (Cq1>Cq2).

In the particular case when the digital value in question is an integer, the first digital input value Sq1 is equal to the real value S (Sq1=S) and the first quantization coefficient Cq1 is equal to unity (Cq1=1). The quantization error affecting Sq1 is then zero, and the quantization error affecting Sq2 is then minimal. In this case, relation (12) is written:

$$e = S \times \varepsilon$$ (13)

The invention furthermore makes it possible for a digital value Sq1 of a first subsystem, having a first specific quantization, to be adapted to a second specific quantization which is associated with a second subsystem that needs to use this digital value, without any constraints governing the respective quantizations of these two subsystems. Specifically, it is sufficient to deliver this digital value Sq1 as a digital input value to a device according to the invention, in which said first quantization coefficient Cq1 is chosen to be equal to that of said first specific quantization, and in which said second quantization coefficient Cq2 is chosen to be equal to that of said second specific quantization.

A third aspect of the invention provides a digitally modulated frequency synthesizer, comprising a phase-locked loop comprising a variable-ratio frequency divider in the return path. The division ratio of said divider is controlled by a digital value obtained in particular from a real value corresponding to the central frequency of a radio channel. The synthesizer furthermore comprises a conversion device as defined, for reducing the quantization error affecting said real value.

DESCRIPTION OF THE PREFERED EMBODIMENTS

Figure 1:
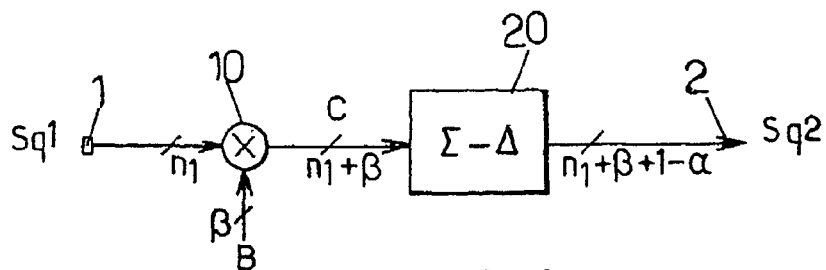
FIG. 1 is a block diagram of a device according to the invention.

FIG. 1 represents the block diagram of a device according to the invention.

The device comprises an input 1 for receiving a digital input value Sq1, which is a quantized value of a variable or constant real value. The value Sq1 is quantized according to a first quantization coefficient Cq1 and encoded over at most n1 bits, where n1 is a nonzero integer. The device also comprises an output 2 for delivering a digital output value Sq2. The value Sq2 is quantized according to a second quantization coefficient Cq2 and encoded over at most n2 bits, where n2 is a nonzero integer.

The device also comprises means, such as a digital multiplier 10, for multiplying the digital input value Sq1 by an integer B encoded over at most β bits, where β is a nonzero integer. The means 10 generate a first intermediate digital value C encoded over at most n1+β bits.

The device further comprises divider means for fixed-point dividing said first intermediate digital value C by the number $2^\alpha$, where α is an integer less than or equal to n1+β. These divider means generate the digital output value Sq2.

According to the invention, these divider means comprise a sigma-delta modulator 20, which receives the intermediate value C as input and delivers the digital output value Sq2 as output. The Σ-Δ modulator is a digital/digital modulator, which receives as input a digital value encoded over n1+β bits and delivers as output a digital value encoded over n1+β+1−α bits. It is preferably a $1^{st}$ order Σ-Δ, modulator, which is the simplest to use. Embodiments with a higher-order Σ-Δ modulator may nevertheless be envisaged.

According to the invention, the number $$\frac{B}{2^\alpha}$$

is furthermore substantially equal to the ratio $$\frac{Cq2}{Cq1}$$

of the second quantization coefficient Cq2 to the first quantization coefficient Cq1.

As mentioned in the introduction, such a device converts the digital value Sq1, quantized according to the quantization coefficient Cq1, into the digital value Sq2, quantized according to the quantization coefficient Cq2.

Figure 2:
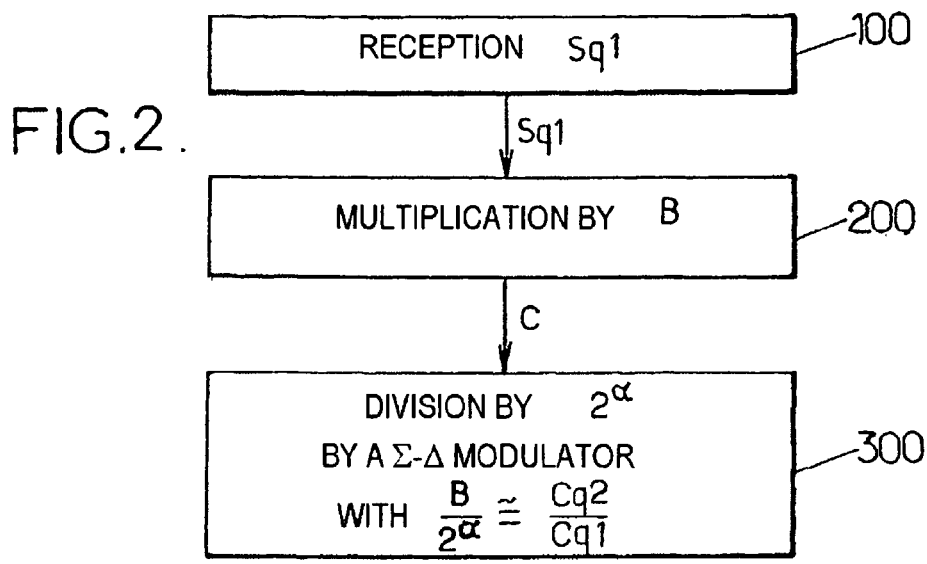
FIG. 2 is a flow chart of the steps in a method according to the invention.

FIG. 2 is a flow chart illustrating the steps in a method according to the invention. The method is carried out by a device as described above with reference to FIG. 1.

In a step 100, the digital input value Sq1 is received.

In a step 200, the value Sq1 is multiplied by the number B in order to generate the first intermediate digital value C.

In a step 300, the first intermediate digital value C is fixed-point divided by the number $2^\alpha$ in order to generate the digital output value Sq2. According to the invention, step 300 is carried out by means of a sigma-delta modulator. The number $$\frac{B}{2^\alpha}$$

is furthermore substantially equal to the ratio $$\frac{Cq2}{Cq1}.$$

Figure 3:
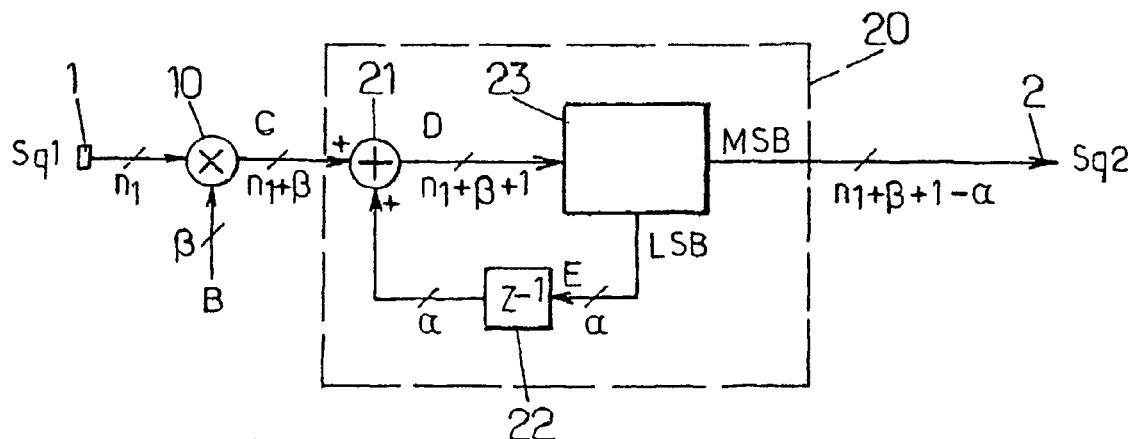
FIG. 3 is a block diagram of a first embodiment of the device in FIG. 1.

The diagram in FIG. 3 illustrates a first embodiment of a device according to the invention, which is suitable for carrying out a first variant of the method.

In this first embodiment, the sigma-delta modulator 20 comprises means 21 such as a digital adder, which receive as input the first intermediate digital value C as a first operand, on the one hand, and a digital error value E as a second operand, on the other hand. The latter is encoded over at most α bits. The means 21 deliver as output a second intermediate digital value D encoded over at most n1+β+1 bits.

The device further comprises selection means 23, such as a digital discriminator, for selecting the n2 most significant bits of the second intermediate digital value D as the digital output value Sq2, and for selecting the α least significant bits of said second intermediate digital value D as the digital error value E. It follows that n2 is equal to n1+β+1−α. The means 23 receive the value D as input and deliver the value Sq2 as well as the value E as output.

A digital discriminator is a circuit which separates the k high-significance bits and the j low-significance bits of a given digital input value in order to generate two digital output values, encoded respectively over k bits and over j bits and each having as its value the value corresponding respectively to said k high-significance bits and to the j low-significance bits. Here, the discriminator 23 separates the n1+β+1−α most significant bits of the second intermediate digital value D, on the one hand, and the α least significant bits of the value D, on the other hand.

Figure 4:
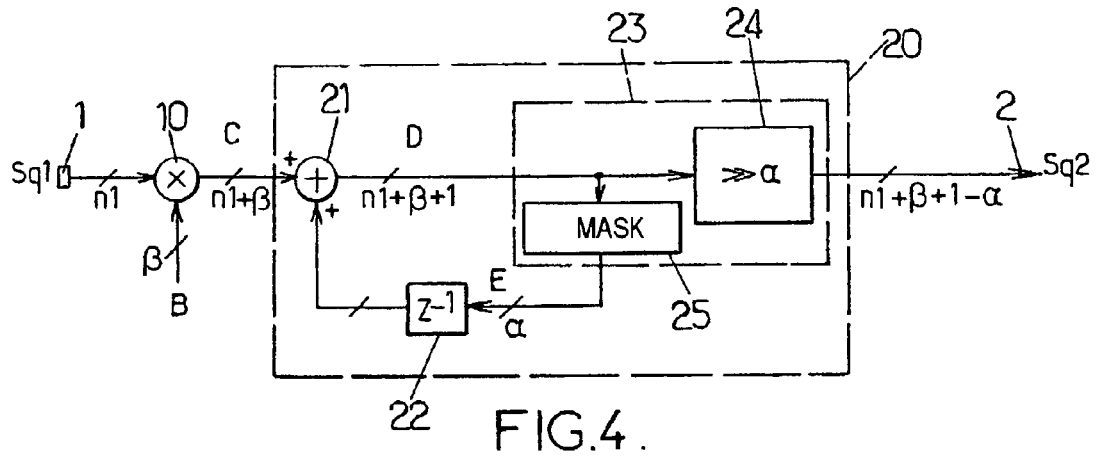
FIG. 4 is a block diagram of a second embodiment of the device in FIG. 1.

The diagram in FIG. 4 illustrates a second embodiment of a device according to the invention, which is suitable for carrying out a second variant of the method.

In this second embodiment, the selection means 23 of the device comprise an operator 24 for shifting to the right by α bits. Such an operator is formed, for example, with the aid of a properly controlled shift register. This operator 24 receives as input the n1+β+1 bits of the second intermediate digital value D. It delivers as output the n1+β+1−α most significant bits of the second intermediate digital value D as a digital output value Sq2.

The selection means 23 furthermore comprise means 25 for applying a mask to the second intermediate digital value D.

Figure 5:
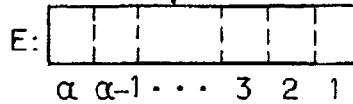
FIG. 5 is a diagram illustrating the application of a mask to a specific digital value.

Such a mask is represented in FIG. 5 with the reference M. It is a digital value stored in an appropriate register and having at most $n1+\beta+1$ bits, the $n1+\beta+1-\alpha$ most significant bits of which are equal to the logical value 0 and the $\alpha$ least significant bits of which are equal to the logical value 1. When it is combined with the second intermediate digital value D in an operation of the logical AND type, it makes it possible to select the $\alpha$ least significant bits of said second intermediate digital value D.

Stated otherwise, the means 25 receive as input the $n1+\beta+1$ bits of the second intermediate digital value D. They deliver as output the $n1+\beta+1-\alpha$ most significant bits of the second intermediate digital value D as the digital error value E.

Figure 6:
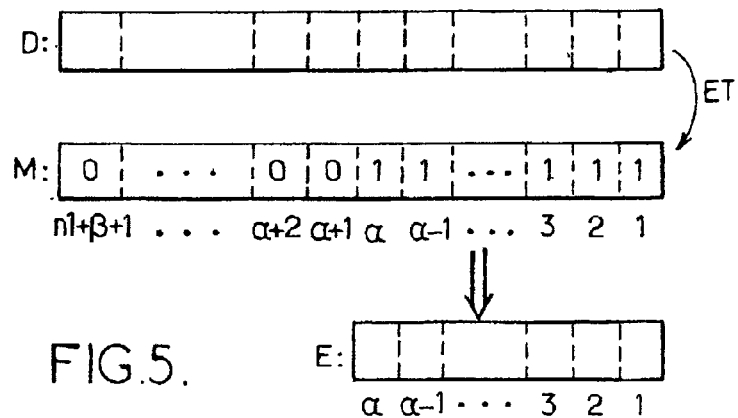
FIG. 6 is a block diagram of a third embodiment of the device in FIG. 1.
Figure 7:
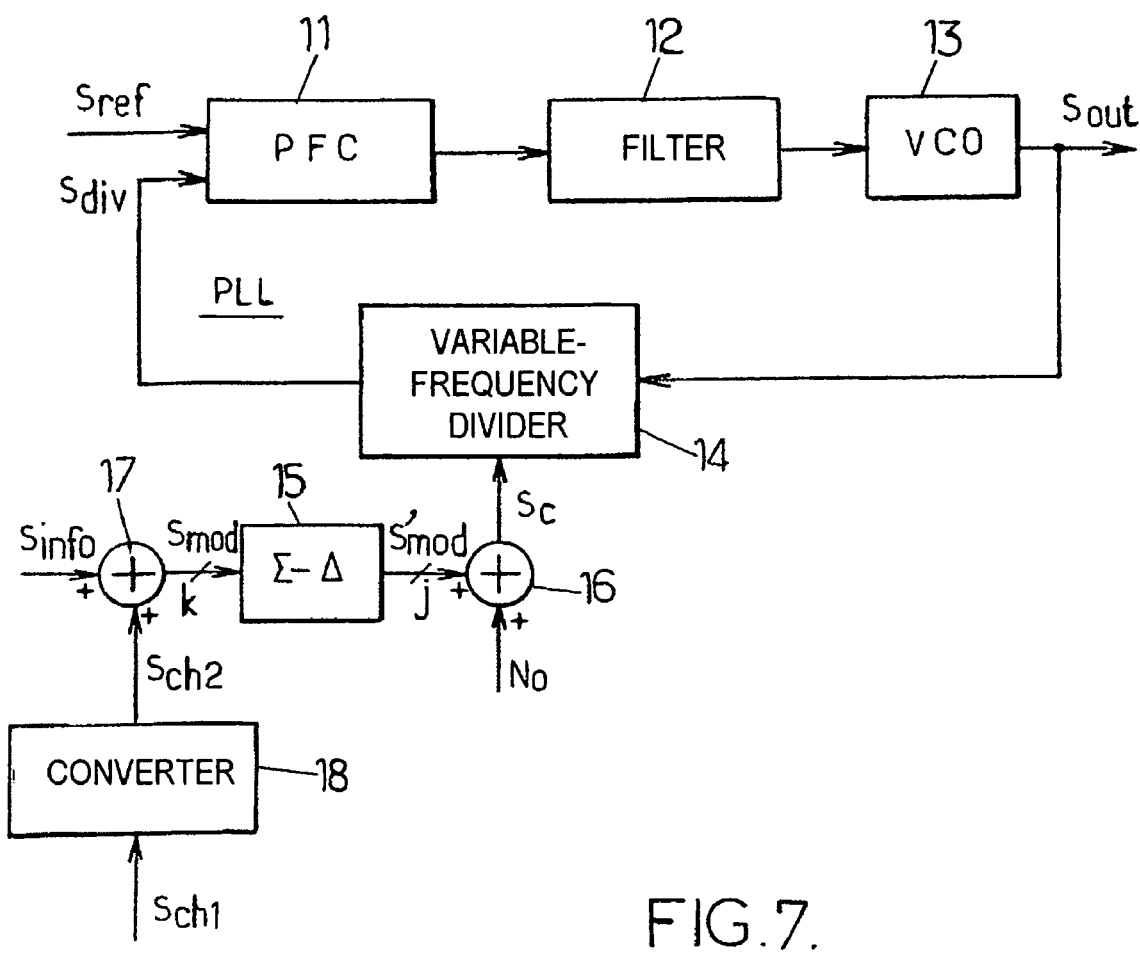
FIG. 7 is a block diagram of a digitally modulated synthesizer incorporating a device according to the invention.

The diagram in FIG. 6 illustrates a third embodiment of a device according to the invention, which is suitable for carrying out a third variant of the method.

In this third embodiment, the selection means 23 of the device still comprise an operator 24 for shifting to the right by $\alpha$ bits, which has the same function as the operator 24 of the device in FIG. 4.

The selection means 23 further comprise an operator 26 for shifting to the left by $\alpha$ bits, which receives as input the $n1+\beta+1-\alpha$ bits of the digital output value Sq2 and delivers as output a third intermediate digital value F, encoded over at most $n1+\beta+1$ bits. The operator 26 is, for example, a properly controlled shift register. They furthermore comprise an operator 27 for taking the difference between the intermediate digital values F and C. The operator 27 is, for example, a digital subtracter. It receives the third intermediate digital value F as a first operand, and the first intermediate digital value C as a second operand. It delivers as output the digital error value E.

In each of the three embodiments described above with reference to FIGS. 3, 4 and 6, the device preferably comprises an operator 22 that applies a unitary delay to the digital error value E for synchronization reasons. Stated otherwise, the error signal E is delivered to the input of the adder means 21 through a unitary delay operator 22.

FIG. 6 shows the diagram of a digitally modulated frequency synthesizer, more commonly referred to by the term DMS, which incorporates a device according to the invention.

Such a circuit can be used for generating a frequency- or phase-modulated radiofrequency signal (in the UHF band lying between 400 and 600 MHz). Applications may be found for it in the radio transmitters or transceivers of a radiocommunication system, particularly in the base stations and/or the mobile terminals of such a system.

A DMS has a structure which is derived from the structure of a fractional N frequency synthesizer, and makes it possible to generate a frequency- or phase-modulated periodic signal.

The DMS includes a phase-locked loop or "PLL", comprising a phrase/frequency comparator 11 or "PFC", a loop filter 12 such as an integrator, and a voltage controlled oscillator 13 or "VCO" in series in a forward channel, and as well as a frequency divider 14 in a return channel. The VCO delivers as output a signal $S_{out}$ which is the output signal of the DMS, the instantaneous frequency of which is $f_{out}$. The PFC receives at a first input a reference signal $S_{ref}$ having a reference frequency $f_{ref}$, and at a second input a signal $S_{div}$ delivered by the frequency divider 14 on the basis of the signal $S_{out}$.

For conventional fractional N synthesis, the frequency divider 14 is a variable-ratio divider making it possible to produce the signal $S_{div}$ by dividing the frequency $f_{out}$ of the signal $S_{out}$ by a division ratio, which alternately has the value of an integer N for a part of the time T1 and the integer N+1 for the rest of the time T2. In this way, the frequency $f_{out}$ of the output signal $S_{out}$ is given as a function of the frequency $f_{ref}$ of the reference signal $S_{ref}$ by:

$$f_{out} = \left(N + \frac{T1}{T1+T2}\right) \times f_{ref} \quad (14)$$

In a digitally modulated synthesizer, the frequency divider 14 includes an input for controlling the division ratio. This ratio is fixed by the value stored in a specific accumulator. In order to prevent spurious lines, due to periodicity of the division ratio changes from N to N+1 and back again, from occurring in the spectrum of the output signal $S_{out}$, however, a DMS known in the prior art furthermore includes a modulator 15 of the digital/digital $\Sigma$-$\Delta$ modulator type.

The modulator 15 includes an input which receives a digital frequency- or phase-modulation value $S_{mod}$ encoded over k bits, and an output which delivers a digital value $S'_{mod}$, corresponding to the processed value $S_{mod}$ and encoded over j bits. The output of the modulator 15 is connected to a first input of a digital adder 16, the second input of which receives a digital value $N_o$ that defines the bottom of the frequency band addressed by the synthesizer. The output of the adder 16 delivers a digital value $S_c$. It is connected to the control input of the divider 14 in order to deliver the value $S_c$ to it.

The DMS also comprises a second digital adder 17, a first input of which receives a digital value $S_{info}$ and a second input of which receives a digital value $S_{ch2}$. The output of the adder 17 delivers the aforementioned digital frequency- or phase-modulation value $S_{mod}$. The digital value $S_{info}$ contains the modulation information (modulating signal), that is to say the useful information to be transmitted. The digital value $S_{ch2}$ corresponds to the central frequency of the radio channel (after the aforementioned value $N_o$ has been added).

The digital values $S_{info}$, $S_{ch2}$, $S_{mod}$ and $S'_{mod}$ and $N_o$ are values that are quantized according to a quantization coefficient Cq2 of the digital system constituted by the DMS.

According to the invention, the value $S_{ch2}$ is delivered by a converter device 18 as described above with reference to FIGS. 2 to 6, on the basis of a digital value $S_{ch_q1}$ stored in an appropriate register. The quantized values $S_{ch1}$ and $S_{ch2}$ correspond to a real value, namely the central frequency of the channel, denoted below by $F_{ch}$. The real value $F_{ch}$ is constant, because the central frequency of the channel is constant. If the device 18 was not there, the real value $F_{ch}$ would be directly quantized according to the quantization coefficient Cq2 of the digital system constituted by the DMS. However, the DMS presented here incorporates a device 18 according to the invention in order to reduce the quantization error affecting the quantized digital value corresponding to the real value $F_{ch}$ (which is a systematic error since this value is constant). Stated otherwise, the DMS comprises a device 18 for converting the digital value $S_{ch1}$ into a digital value $S_{ch2}$, which is quantized according to the quantization coefficient Cq2 of the digital system constituted by the DMS.

To apply that which has been described above, a choice is therefore made to implement a converter device 18 of the type described above, for which Cq1 is equal to unity (Cq1=1, because the real value $F_{ch}$ is integer) and for which Cq2 is the quantization coefficient of the quantization of the DMS.

A numerical example for illustrating the advantages offered by the invention in this application will be given below. In this example:

$F_{ref}$=9.6 MHz (megahertz);
k=22;
j=4;
$F_{ch}$=400017.5 kHz (kilohertz);
$N_o$=round(395 MHz/$F_{ref}$);
$e_d$=4 Hz (hertz).

The frequency resolution of such a DMS is given by $$\frac{F_{ref}}{2^{k-j}},$$

where k is the number of bits at the input of the sigma-delta modulator 15, and where j is the number of bits at the output of this modulator. The frequency resolution of the DMS, that is to say $$\frac{1}{Cq2},$$

is therefore:

$$\frac{1}{Cq2} = \frac{F_{ref}}{2^{k-j}} = \frac{9.6 \cdot 10^6}{2^{18}} \approx 36.62 \text{ Hz}$$

The value $F_{min}$, corresponding to the bottom of the frequency band addressed by the DMS, is determined by the digital value $N_o$ according to the relation $F_{min}=N_o \times F_{ref}$. Here, therefore, $F_{min}$=41×9.6·10$^6$=393.6 MHz.

Let us first consider what the situation would be without the device 18 according to the invention, that is to say if Sch1=Sch2. We would have:

$Fch2$=round[$(F_{ch}-F_{min}).Cq2$]=175241

The systematic quantization error affecting the central frequency of the radio channel would therefore be:

$$e = F_{ch} - \left(\frac{Fch2}{Cq2} + F_{min}\right)$$

i.e.:

$$e = 400017.5 \cdot 10^3 - \left(\frac{175241}{Cq2} + 393.6 \cdot 10^6\right) = -17.08 \text{ Hz}$$

This value exceeds (in absolute value) the acceptable error $e_d$.

Let us now consider what happens with the conversion device 18 according to the invention. Since the signal intended to be represented is integer, we have Cq1=1.

The following approximation is chosen:

$$Cq2 \approx \frac{B}{2^\alpha} = \frac{229065}{2^{23}}.$$

In other words, a choice is made to implement a device according to the invention with B=229065 and α=23.

The quantization error can be determined by using the relation (13) given in the introduction, which is valid in the case when the real digital value at the input of the device (here, the constant value $F_{ch}-F_{min}$) is an integer. It will be recalled that this relation is then written:

$$e = S \cdot \varepsilon = S \cdot \frac{Cq1}{Cq2}\frac{B}{2^\alpha} 1 \cong 2.17 \text{ Hz}$$

where S denotes the real digital value at the input of the device (here $F_{ch}$).

Whence it follows that e≅2.17 Hz. The goal of a quantization error less than 4 Hz affecting the value of the central frequency of the radio channel has therefore indeed been achieved, without having to modify the quantization of the system. Here, the invention makes it possible to reduce the systematic quantization error affecting the value of the central frequency of the radio channel from 17 Hz to 2 Hz.

A better result could be obtained by increasing the precision of the approximation for $$\frac{Cq2}{Cq1},$$

but at the cost of increasing the number β and the number α.

The invention claimed is:

1. A method for converting a digital input value quantized according to a first quantization coefficient and encoded over at most n1 bits, into a digital output value quantized according to a second quantization coefficient and encoded over at most n2 bits, where n1 and n2 are nonzero integers, comprising the steps of:

multiplying the digital input value by an integer B encoded over at most β bits, where β is a nonzero integer, so as to generate a first intermediate digital value encoded over at most n1+β bits; and fixed-point dividing said first intermediate digital value by a number $2^\alpha$, where α is an integer less than or equal to n1+β, so as to generate said digital output value, wherein a number $$\frac{B}{2^\alpha}$$

is substantially equal to the ratio of said second quantization coefficient to said first quantization coefficient;

and wherein the step of fixed point dividing is carried out by means of a sigma-delta modulator.

2. The method as claimed in claim 1, wherein the step of fixed-point dividing comprises the steps of:

adding said first intermediate digital value, on the one hand, and a digital error value encoded over at most α bits, on the other hand, so as to generate a second intermediate digital value encoded over at most $n1+\beta+1$ bits;

selecting a given number n2 of the most significant bits of said second intermediate digital value as the digital output value, where n2 is equal to $n1+\beta+1-\alpha$; and selecting a given number $\alpha$ of the least significant bits of said second intermediate digital value as the digital error value.

3. The method as claimed in claim 2, wherein the steps of selecting are carried out together with the aid of a discriminator for separating the $n1+\beta+1-\alpha$ most significant bits of the second intermediate digital value, on the one hand, and the $\alpha$ least significant bits of said second intermediate digital value, on the other hand.

4. The method as claimed in claim 2, wherein the step of selecting the n2 most significant bits is carried out via an operation of shifting to the right by $\alpha$ bits, which is applied to the $n1+\beta+1$ bits of the second intermediate digital value.

5. The method as claimed in claim 4, wherein the step of selecting the $\alpha$ least significant bits is carried out by applying to the second intermediate digital value a mask having at most $n1+\beta+1$ bits, the $n1+\alpha+1-\alpha$ most significant bits of which are equal to the logical value 0 and the $\alpha$ least significant bits of which are equal to the logical value 1.

6. The method as claimed in claim 4, wherein the step of selecting the $\alpha$ least significant bits is carried out, on the one hand, by an operation of shifting to the left by $\alpha$, which is applied to the $n1+\beta+1-\alpha$ bits of the digital output value for generating a third intermediate digital value encoded over at most $n1+\beta+1$ bits and, on the other hand, by a difference operation between said third intermediate digital value and said first intermediate digital value.

7. The method as claimed in claim 1, wherein neither the first quantization coefficient nor the second quantization coefficient is an integer multiple of the other.

8. A device for converting a digital input value quantized according to a first quantization coefficient and encoded over at most n1 bits, into a digital output value quantized according to a second quantization coefficient and encoded over at most n2 bits, where n1 and n2 are nonzero integers, comprising:

multiplier means for multiplying the digital input value by an integer B encoded over at most $\beta$ bits, where $\beta$ is a nonzero integer, so as to generate a first intermediate digital value encoded over at most $n1+\beta$ bits; and divider means for fixed-point dividing said first intermediate digital value by the number $2\alpha$, where $\alpha$ is an integer less than or equal to $n1+\beta$, so as to generate said digital output value, wherein a number $$\frac{B}{2^\alpha}$$

is substantially equal to the ratio of said second quantization coefficient to said first quantization coefficient;

and wherein said divider means comprise a sigma-delta modulator.

9. The device as claimed in claim 8, wherein the sigma-delta modulator is a $1^{st}$ order sigma-delta modulator.

10. The device as claimed in claim 9, wherein the sigma-delta modulator comprises:

adder means which receive as input said first intermediate digital value as a first operand, on the one hand, and a digital error value encoded over at most $\alpha$ bits as a second operand, on the other hand, and which deliver as output a second intermediate digital value encoded over at most $n1+\beta+1$ bits;

selection means for selecting a given number n2 of the most significant bits of said second intermediate digital value as the digital output value, where n2 is equal to $n1+\beta+1-\alpha$; and for selecting the a given number $\alpha$ of the least significant bits of said second intermediate digital value as the digital error value.

11. The device as claimed in claim 10, wherein said selection means comprise a discriminator for separating the $n1+\beta+1-\alpha$ most significant bits of the second intermediate digital value, on the one hand, and the $\alpha$ least significant bits of said second intermediate digital value, on the other hand.

12. The device as claimed in claim 10, wherein said selection means comprise an operator for shifting to the right by $\alpha$ bits, which receives as input the $n1+\beta+1$ bits of the second intermediate digital value, and which delivers as output the $n1+\beta+1-\alpha$ most significant bits of the second intermediate digital value as a digital output value.

13. The device as claimed in claim 12, wherein said selection means further comprise means for applying to the second intermediate digital value a mask having at most $n1+\beta+1$ bits, the $n1+\beta+1-\alpha$ most significant bits of which are equal to the logical value 0 and the $\alpha$ least significant bits of which are equal to the logical value 1, so as to select the $\alpha$ least significant bits of said second intermediate digital value as the digital error value.

14. The device as claimed in claim 12, wherein said selection means further comprise, on the one hand, an operator for shifting to the left by $\alpha$ bits, which receives as input the $n1+\beta+1-\alpha$ bits of the digital output value and delivers as output a third intermediate digital value encoded over at most $n1+\beta+1$ bits and, on the other hand, a difference operator which receives said third intermediate digital value as a first operand and said first intermediate digital value as a second operand, and which delivers as output the digital error value.

15. The device as claimed in claim 8, wherein the error signal is delivered to the input of the adder means through a unitary delay operator.

16. A digitally modulated frequency synthesizer, comprising a phase-locked loop comprising a variable-ratio frequency divider in a return path, wherein the division ratio is controlled by a digital value obtained in particular from a real value corresponding to the central frequency of a radio channel, the synthesizer further comprising a conversion device as claimed in claim 8 for reducing the quantization error affecting said real value.

* * * * *